United States Patent
Aoki

(10) Patent No.: US 9,507,108 B2
(45) Date of Patent: Nov. 29, 2016

(54) OPTICAL MODULE

(71) Applicant: FUJITSU OPTICAL COMPONENTS LIMITED, Kawasaki-shi, Kanagawa (JP)

(72) Inventor: Shinichi Aoki, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 14/299,655

(22) Filed: Jun. 9, 2014

(65) Prior Publication Data
US 2014/0286614 A1  Sep. 25, 2014

Related U.S. Application Data

(62) Division of application No. 13/325,817, filed on Dec. 14, 2011, now abandoned.

(51) Int. Cl.
```
G02B 6/36      (2006.01)
G02B 6/255     (2006.01)
H04B 10/00     (2013.01)
H05K 7/20      (2006.01)
G02B 6/42      (2006.01)
```
(Continued)

(52) U.S. Cl.
CPC ........... *G02B 6/4269* (2013.01); *H05K 1/0204* (2013.01); *H05K 1/0206* (2013.01); *H05K 7/205* (2013.01); *G02B 6/4281* (2013.01); *H05K 1/189* (2013.01); *H05K 3/4046* (2013.01); *H05K 2201/066* (2013.01); *H05K 2201/09054* (2013.01); *H05K 2201/10689* (2013.01)

(58) Field of Classification Search
CPC ........... H01L 23/3677; H05K 1/0204; H05K 1/0206; H05K 2201/066; H05K 3/429; H05K 7/205; G02B 6/4269
USPC ....... 385/88, 92, 53; 398/135, 139; 361/715, 361/719, 720
See application file for complete search history.

(56) References Cited

U.S. PATENT DOCUMENTS 6,205,028 B1 * 3/2001 Matsumura .................. 361/720
6,340,796 B1   1/2002 Smith et al.

(Continued)

FOREIGN PATENT DOCUMENTS

| | | |
|---|---|---|
| JP | 9-102688 | 4/1997 |
| JP | 11-345987 | 12/1999 |

(Continued)

OTHER PUBLICATIONS

Patent Abstracts of Japan, Publication No. 09-102688, Published Apr. 15, 1997.

(Continued)

*Primary Examiner* — Robert Tavlykaev
(74) *Attorney, Agent, or Firm* — Staas & Halsey LLP

(57) ABSTRACT

An optical module includes: a flexible board having a first surface on which a component is mounted and a second surface opposite to the first surface; a bottom electrode part having a bottom surface on which a heat release electrode is provided, the bottom electrode part mounted on the first surface of the flexible board; and a heat release member configured to absorb heat from the bottom electrode part and release the heat to outside. The heat release member is arranged close to said second surface of the flexible board at a position where the bottom electrode part is mounted.

15 Claims, 10 Drawing Sheets

(51) Int. Cl.
*H05K 1/02* (2006.01)
*H05K 1/18* (2006.01)
*H05K 3/40* (2006.01)

(56) References Cited

U.S. PATENT DOCUMENTS

| | | | |
|---|---|---|---|
| 6,445,475 | B1 | 9/2002 | Okubora et al. |
| 6,605,778 | B2 | 8/2003 | Dorfler et al. |
| 7,130,195 | B2 | 10/2006 | Kawano et al. |
| 7,264,405 | B2 | 9/2007 | Ikeuchi |
| 7,313,331 | B2 | 12/2007 | Akashi et al. |
| 7,616,446 | B2 * | 11/2009 | Watanabe ............ G06F 1/203 174/252 |
| 7,764,462 | B1 | 7/2010 | Liu et al. |
| 7,903,422 | B2 | 3/2011 | Watanabe |
| 2003/0002260 | A1 | 1/2003 | Hasebe et al. |
| 2004/0037057 | A1 | 2/2004 | Okada |
| 2004/0067030 | A1 | 4/2004 | Rathnam et al. |
| 2004/0071412 | A1 | 4/2004 | Nakura et al. |
| 2004/0136162 | A1 | 7/2004 | Asai et al. |
| 2005/0069266 | A1 | 3/2005 | Kouta et al. |
| 2005/0282381 | A1 * | 12/2005 | Cohen ............ H01L 23/3677 438/637 |
| 2008/0001281 | A1 | 1/2008 | Nishimura et al. |
| 2009/0002950 | A1 * | 1/2009 | Gertiser ............ H05K 1/0206 361/709 |
| 2010/0027947 | A1 | 2/2010 | Dutta |

FOREIGN PATENT DOCUMENTS

| | | |
|---|---|---|
| JP | 2003-115681 | 4/2003 |
| JP | 2004-87594 | 3/2004 |
| JP | 2004-140171 | 5/2004 |
| JP | 2005-5629 | 1/2005 |
| JP | 2006-86433 | 3/2006 |
| JP | 2006-294754 | 10/2006 |
| JP | 2007-294619 | 11/2007 |

OTHER PUBLICATIONS

Patent Abstracts of Japan, Publication No. 2003-115681, Published Apr. 18, 2003.
Patent Abstracts of Japan, Publication No. 2004-140171, Published May 13, 2004.
Patent Abstracts of Japan, Publication No. 2005-005629, Published Jan. 6, 2005.
Patent Abstracts of Japan, Publication No. 2006-294754, Published Oct. 26, 2006.
Patent Abstracts of Japan, Publication No. 2007-294619, Published Nov. 8, 2007.
International Search Report mailed Aug. 18, 2009 in corresponding International Application No. PCT/JP2009/060888.
U.S. Office Action issued Oct. 24, 2012 in corresponding U.S. Appl. No. 13/325,817.
Japanese Office Action issued Nov. 6, 2012 in corresponding Japanese Patent Application No. 2011-519331.
U.S. Office Action issued May 1, 2013 in corresponding U.S. Appl. No. 13/325,817.
U.S. Office Action issued Sep. 26, 2013 in corresponding U.S. Appl. No. 13/325,817.
U.S. Office Action issued Mar. 7, 2014 in corresponding U.S. Appl. No. 13/325,817.
U.S. Appl. No. 13/325,817, filed Dec. 14, 2011, Shinichi Aoki, Fujitsu Optical Components Limited.

* cited by examiner

OPTICAL MODULE

CROSS-REFERENCE TO RELATED APPLICATIONS

This application is a U.S. continuation application, filed under 35 USC §111(a) and claiming the benefit under 35 USC §§120 and 365(c), of PCT application JP2009/060888 filed Jun. 15, 2009 and is a divisional application filed under USC §§111 and 120 of U.S. Ser. No. 13/325,817, filed Dec. 14, 2011, the contents of which are incorporated herein by reference.

FIELD

The embodiments discussed herein are directed to an optical module incorporating a heat-generating component therein.

BACKGROUND

In recent years, with increase in a communication speed and a communication data amount in optical communications, there is a demand for optical modules used in optical communications to achieve a high-speed operation and a high-density structure. As speeding-up and densification are progressed, power consumption of an optical module has been increased and an amount of heat generated in a limited narrow space in the optical module has been increased. That is, an amount of electric power consumed by an optical module has been remarkably increased, which results in a remarkable increase in an amount of heat generated by electronic parts of the optical module. Because an arrangement of internal components must be optimized due to miniaturization of optical modules, it has become difficult to acquire a sufficient space needed for radiation of heat. Particularly, characteristics of a high-speed IC used for controlling and driving an optical module tend to be influenced by an ambient temperature. It is needed for such a high-speed IC to take measures for heat-release so as to maintain the characteristics stable.

A high-speed IC may be provided with a GND electrode (bottom electrode) on a bottom surface of an IC package in order to promote releasing heat generated by an IC chip incorporated therein and to improve a grounding property. An electronic part provided with a GND electrode (bottom electrode) on a bottom surface thereof is referred to as a bottom electrode part. The bottom electrode component releases heat generated by an IC chip incorporated therein through the bottom electrode. Basically, the bottom electrode is soldered to a printed circuit board and a GND pattern, which is capable of releasing a sufficient amount of heat, is provided to the printed circuit board to release heat through the bottom electrode and the GND pattern. Additionally, there is suggested a method of causing a package (a surface opposite to a bottom electrode) of a bottom electrode component to contact with a mechanical part containing a surrounding housing via a silicon heat-release sheet.

Thus, there is an increasing demand for a structure, which is capable of performing an efficient heat-release with respect to the bottom electrode component.

On the other hand, due to an influence of the recent speeding-up of an operation of an optical module, a demand for improvement in the electromagnetic environmental performance (EMI-ESD) has become severe. In order to clear the EMI performance specified by severe standard such as FCC PART15 or CISPR22, a printed circuit board is incorporated into a mechanical component (mainly a housing) of an optical module as much as possible to eliminate an empty space in the housing. Additionally, in order to improve an ESD resistance, it is usual to separate a housing from a grounding part of a printed circuit board.

In a case of an optical transceiver module as an example of an optical module, an excellent EMI characteristic can be achieved by incorporating a printed circuit board into a housing. In such a case, in view of an ESD characteristic, it is necessary to separate the housing from a grounding part of the printed circuit board. Accordingly, the bottom electrode of a bottom electrode component is not permitted to contact with the housing. However, if the printed circuit board is incorporated into the housing, heat-release can be done more efficiently by causing the bottom electrode component to contact with the housing than releasing heat in an interior of the optical module through the printed circuit board.

Thus, it is suggested to divide a housing into a frame grounding part (FG) and a signal grounding part (SG), and causing the signal grounding part (SG) to contact with a bottom electrode of a bottom electrode component. However, a portion between the frame grounding part (FG) and the signal grounding part (SG) of the housing may deteriorate the EMI characteristic. If an insulating plate is provided between the frame grounding part (FG) and the signal grounding part (SG) of the housing, there may be a problem in a high-speed operation of the bottom electrode component because there is no grounding connection to the insulating plate.

Moreover, there is suggested a method of causing a package of a bottom electrode component (a surface opposite to a bottom electrode) to contact with a mechanical component including a surrounding housing via a silicon heat-release sheet. According to this method, separation of grounding and good EMI characteristic can be acquired. However, the heat-release performance may not be improved, even if the mechanical component is brought into contact with the housing via the silicon heat-release sheet, due to a material having an extremely large heat resistance, which is larger than 10° C./W, may be used for the package of the bottom electrode component because the bottom electrode component is based on releasing heat from the bottom electrode. Further, if the housing is brought into contact with the package of the bottom electrode component, static electricity accumulated in the housing may be discharged to the bottom electrode component, which causes a problem of deterioration of the ESD characteristic.

Then, the following methods are suggested as a method of promoting heat-release from the bottom electrode of the bottom electrode component.

It is suggested to release heat from a bottom electrode of a bottom electrode component to a housing through a thin portion of a printed circuit board by reducing a thickness of the printed circuit board in an area where the bottom electrode component is mounted and causing the housing to contact with the thin portion of the printed circuit board from the opposite side of the bottom electrode of the bottom electrode component (for example, refer to Japanese Laid-Open Patent Application No. 2004-140171).

Moreover, it is suggested to release heat of a heat-generating component through a flexible board by mounting the heat-generating part to the flexible bard, which is thinner than a rigid board (for example, refer to Japanese Laid-Open Patent Application No. 2007-294619). According to this method, heat transferred from the heat-generating component is transmitted to a pattern having a large area on the flexible board to release the heat from the pattern.

According to the method of releasing heat by thinning an area of a printed circuit board where a bottom electrode component is mounted, a material forming the printed circuit board is merely thinned but the material of the printed circuit board itself is not changed. The material of the printed circuit board has an extremely low thermal conductivity such as a glass-epoxy in many cases. Thus, a large improvement cannot be acquired even if the printed circuit board is thinned. Additionally, because a process of thinning the printed circuit board by machining only a portion of the printed circuit board is added to the manufacturing process, a manufacturing cost is increased. Further, the thinned portion of the printed circuit board is easily broken, which raises a problem in that it is difficult to maintain good mounting reliability.

According to the method of releasing heat of a heat-generating part to a surrounding area through the flexible board by mounting the heat-generating part onto the flexible board, which is a method of diffusing heat by using a conductive layer of the flexible board, the heat-releasing efficiency cannot be improved if the area of the flexible board is large (that is, the area of the conductive layer is large). Additionally, because the flexible board is deformed easily, there is a problem in that it is difficult to maintain the mounting reliability of the heat-generating component mounted on the flexible board.

Here, there exists a restriction on mounting also in a high-speed IC and an optical input/output device connected to the high-speed IC. It is desirable to arrange the high-speed IC near the optical input/output device on a circuit board. This is because if the high-speed IC is remote from the optical input/output device, a possibility of deterioration of radio frequency characteristic and intrusion of noise is raised. Normally, an optical input/output device is connected to a high-speed IC through a flexible board. However, in many cases, a terminal portion of the flexible board is an area where bending is prohibited. In the bending prohibited area, terminal parts are connected to a rigid board by soldering or connectors, and the entire area of the bending prohibited area is supported by the rigid board by being closely contacted with the rigid board. Thereby, the bending prohibiting area is maintained in a flat state, and, thus, the flexible board is prevented from being bent in the bending prohibiting area.

On the other hand, it is desirable to arrange the bottom electrode component such as a high-speed IC at a position as electrically close to an optical component as possible in order to improve communication characteristics. If possible, it is desirable to arrange the bottom electrode component on a flexible board, which connects an optical input/output device to a rigid board. However, the flexible board may be easily deformed or damaged by an external force. Thus, if the bottom electrode part is mounted on a flexible board, the mounting reliability of the bottom electrode component may be deteriorated due to deformation of the flexible board. Particularly, because the bending prohibited area of the flexible board is weak to an external force, it is required to provide a reinforcing function with respect to an external force.

SUMMARY

There is provided according to an aspect of the invention an optical module comprising: a flexible board having a first surface on which a component is mounted and a second surface opposite to the first surface; a bottom electrode part having a bottom surface on which a heat release electrode is provided, the bottom electrode part mounted on the first surface of the flexible board; and a heat release member configured to absorb heat from the bottom electrode part and release the heat to outside, wherein the heat release member is arranged close to said second surface of the flexible board at a position where the bottom electrode part is mounted.

The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

DESCRIPTION OF EMBODIMENT(S)

Embodiments of the present invention will be explained with reference to the accompanying drawings.

Figure 1:
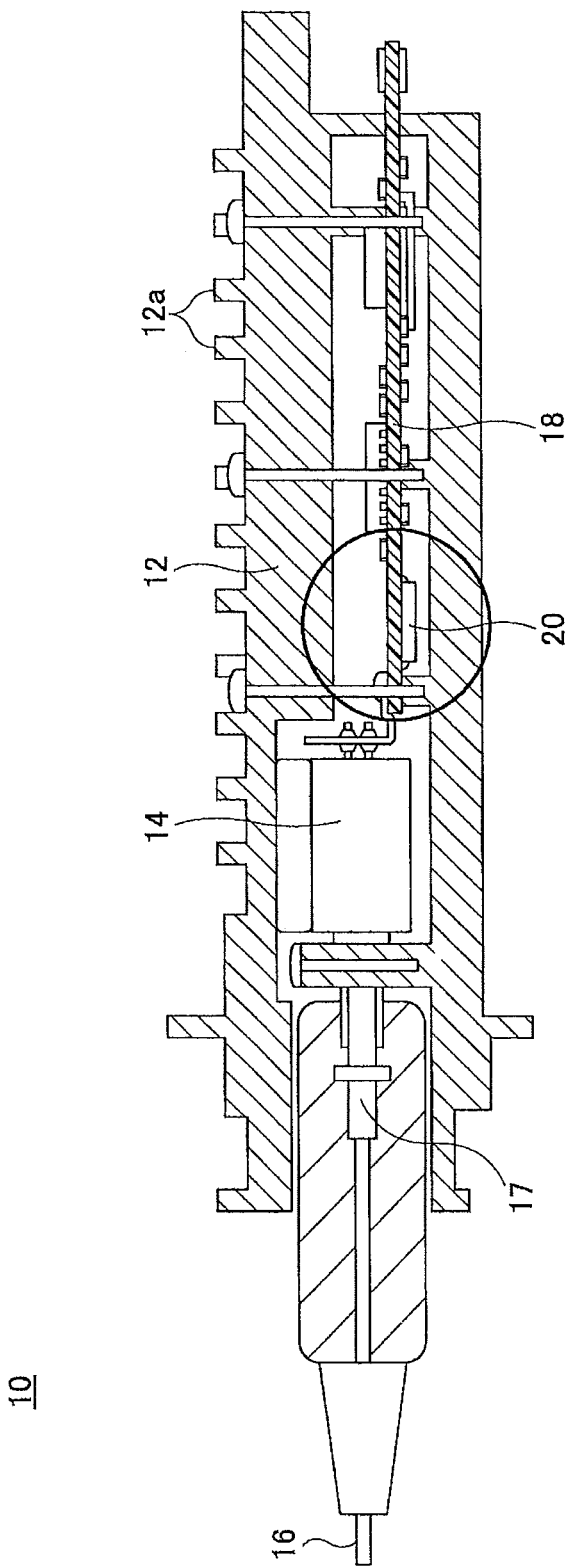
FIG. 1 is a cross-sectional view of an example of an optical transceiver module.
Figure 2:
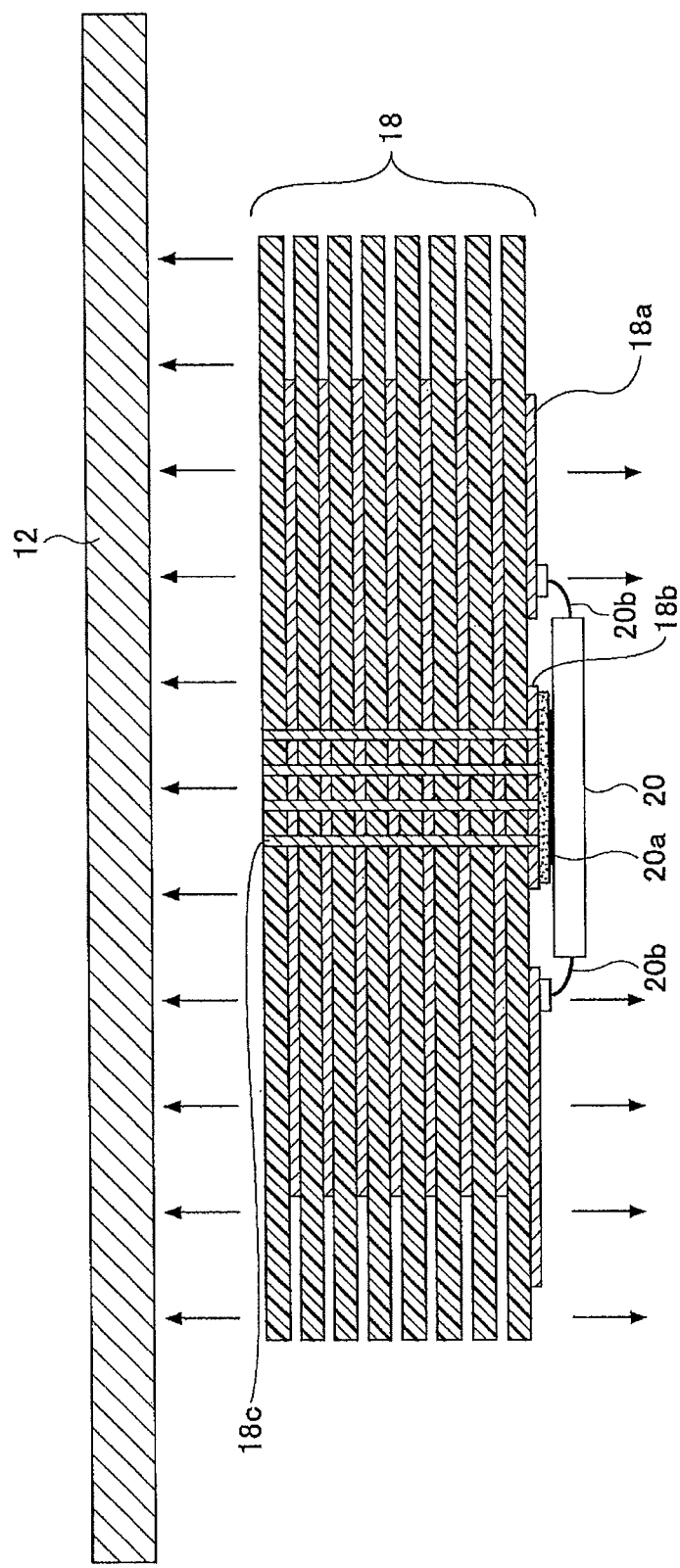
FIG. 2 is an enlarged view of a portion surrounded by a circle in FIG. 1.

First, a description will be given, with reference to FIG. 1 and FIG. 2, of an optical module to which the present invention is applicable. FIG. 1 is an example of an optical module. FIG. 2 is an enlarged view of a portion surrounded by a circle in FIG. 1.

The optical module illustrated in FIG. 1 is an optical transceiver module 10. Accommodated in a housing 12 of the optical transceiver module 10 are an optical input/output device 14, an optical connector 17 for connecting an optical fiber 16 to the optical input/output device 14, and a control board 18 for controlling the optical input/output device 14. The housing 12 is a mechanism element of the optical transceiver module 10. The housing 12 is formed of a metal having a good thermal conductivity such as an aluminum alloy.

The control board 18 is a printed circuit board (rigid board) having a relatively large rigidity and is formed of a material such as a glass-epoxy or the like. Electronic parts are mounted on both sides of the control board 18. The electronic parts mounted on the control board 18 include a driver IC and an amplifier IC. The driver IC is a device to control and amplify electric signals for driving the optical input/output device 14. The amplifier IC is a device to amplify the electric signals output from the optical input/ output device 14. Because the driver IC and the amplifier IC handle high-speed signals, the amplitude of the signals handled by the driver IC and the amplifier IC is small. Thus, it is desirable to arrange the driver IC and the amplifier IC as close to the optical input/output device 14 as possible. That is, in FIG. 1, the driver IC and the amplifier IC are arranged in a portion surrounded by a circle in FIG. 1. It is assumed that the IC indicated in the portion surrounded by the circle in FIG. 1 is a driver IC 20.

The driver IC 20 is a bottom electrode part having a bottom electrode 20*a* as illustrated in FIG. 2. Heat generated in the driver IC 20 is efficiently radiated from the bottom electrode 20*a*. Lead terminals 20*b* extend from side surfaces of the driver IC 20 and are soldered to wiring patterns 18*a* of the control board 18. The wiring patterns 18*a* include a grounding (GND) pattern in many cases.

As illustrated in FIG. 2, the control board 18 is a multi-layer printed circuit board formed by a rigid board having electrically conductive layer formed of, for example, copper and a base material formed of an insulating material such as, for example, glass-epoxy, which are laminated in a multiple layer structure. A heat radiation pad 18*b* is formed on a portion of the control board 18 facing the bottom electrode 20*a* of the driver IC 20. The heat radiation pad 18*b* is a solid pattern formed of the same material as the wiring pattern 18*a*, and is formed as a part of the wiring pattern 18*a*. A plurality of vias 18*c* extend from the heat radiation pad 18*b* to the opposite side of the control board 18 by penetrating through the control board 18.

The driver IC 20, which is a bottom electrode part, is mounted on the control board 18 in a state where the bottom electrode 20*a* faces the heat radiation pad 18*b*. An adhesive having a high heat transfer coefficient (heat radiation adhesive) is filled between the bottom electrode 20*a* and the heat radiation pad 18*b*. Accordingly, heat generated in the driver IC 20 is transmitted to the wiring pattern 10*a* as a GND pattern through the heat radiation pad 18*b* and, then, radiated to the surrounding area.

In the optical transceiver module having the above-mentioned structure, a large part of heat from the driver IC 20 is transmitted to the control board 18 and released to air surrounding the control board. Thus, the heat released to the air is transmitted to the housing 12, and is released outside the housing 12 through outer surfaces and fins 12*a* of the housing 12. That is, heat released from the driver IC 20 is transmitted first through the control board 18, and, then, transmitted through the surrounding air, and, then, transmitted to the housing 12. Thus, because the thermal conductivity of air is not high and the heat transfer coefficients between air and the housing and between the housing and the control board are not high, if the heat release or heat radiation can be achieved without routing through air, the heat release efficiency can be improved.

Figure 3:
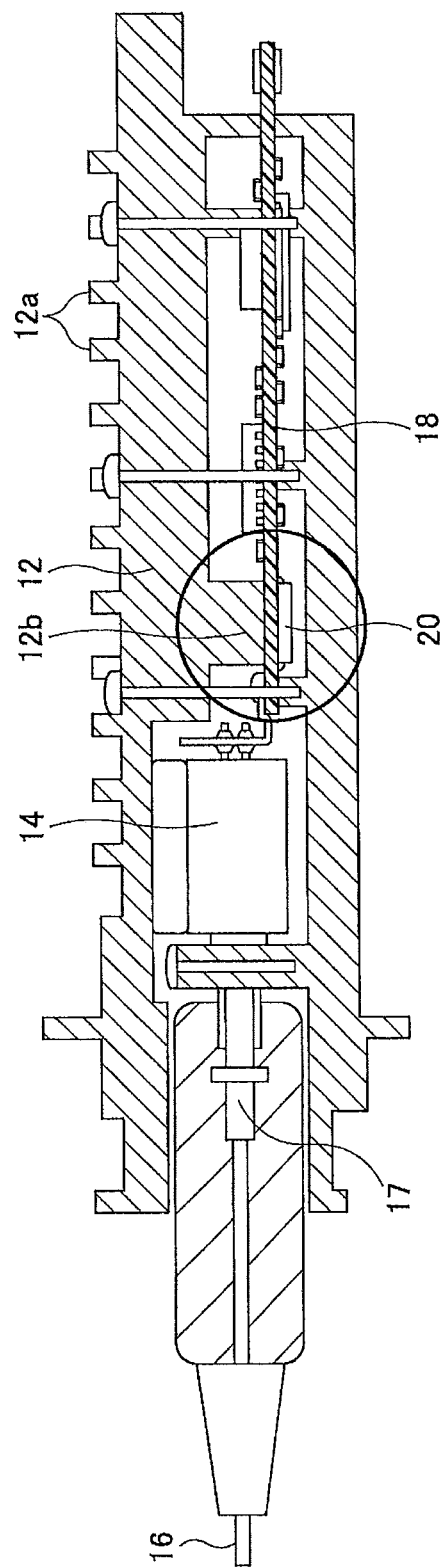
FIG. 3 is a cross-sectional view of another example of an optical transceiver module.
Figure 4:
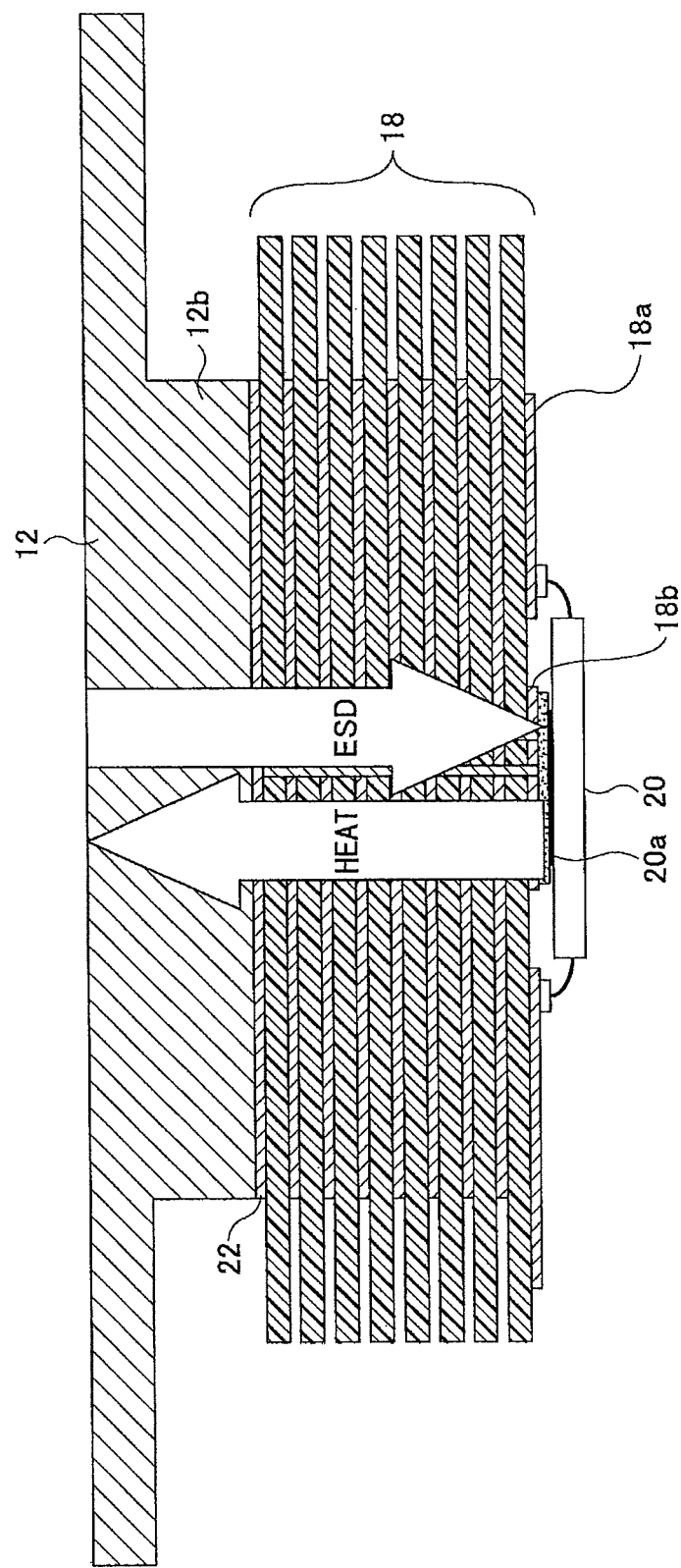
FIG. 4 is an enlarged view of a portion surrounded by a circle in FIG. 3.

Thus, in an optical transceiver module 10A illustrated in FIGS. 3 and 4, a heat-receiving part 12*b* of a portion of the housing is connected to the control board 18 corresponding to a portion where the driver IC 20 is mounted, via a heat release sheet 22 so that heat released from the driver IC 20 is directly transmitted to the housing 12 without transmitting through air. However, because the vias 18*c*, which are electrically connected to the bottom electrode 20*a* of the driver IC 20, extend to the opposite surface of the control board 18, the housing 12 and the driver IC 20 are set in a state where they are electrically connected to each other. Therefore, if a static charge accumulated in the housing 12 is discharged to the driver IC 20 through the vias 18*c*, a problem of ESD may occur.

Accordingly, in the embodiments mentioned below, heat released from the driver IC 20 can be directly transmitted to the housing 12 without transmitting through air while the housing 12 and the driver IC 20 are electrically insulated from each other.

Figure 5:
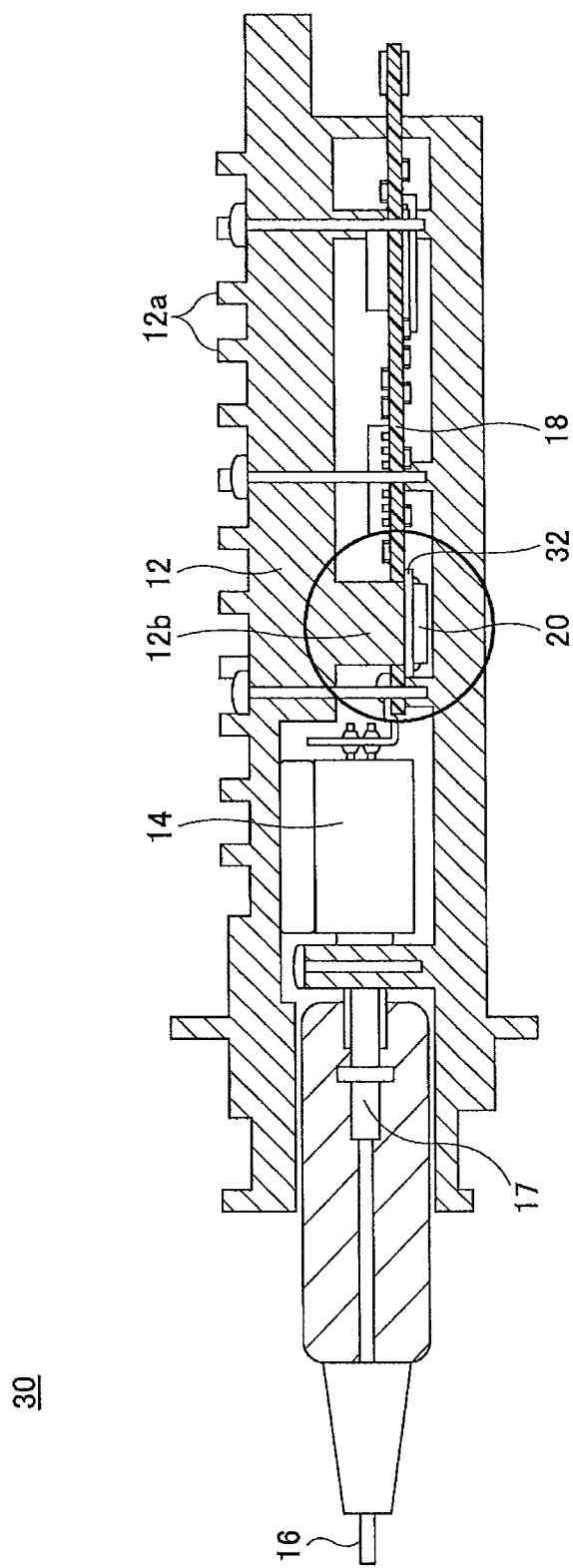
FIG. 5 is a cross-sectional view of an optical transceiver module according to a first embodiment.

First, a description will be given, with reference to FIG. 5 through FIG. 8, of an optical module according to a first embodiment. FIG. 5 is a cross-sectional view of an optical transceiver module 30, which is an example of the optical module according to the first embodiment. In FIG. 5, parts that are the same as the parts illustrated in FIG. 1 are given the same numerals, and descriptions thereof will be omitted.

Similar to the optical transceiver module 10A illustrated in FIG. 3, the housing 12 of the optical transceiver module 30 has a heat-receiving part 12*b*. However, the heat-receiving part 12*b* is not connected to the control board 18 but connected a flexible board 32 on which the driver IC 20 is mounted.

According to the present embodiment, the flexible board 32 is mounted on the control board in a stated where the driver IC is mounted on the flexible board 32. The flexible board 32 has a first surface on which the driver IC 20 is mounted and a second surface opposite to the first surface. A penetrating opening in which the heat-receiving part 12*b* of the housing can be inserted is provided in a portion of the control board where the flexible board 32 is mounted. That is, the flexible board 32 having the driver IC 20 mounted thereon is mounted on the control board 18 to cover the penetrating opening of the control board 18, and the second surface of the flexible board 32 is exposed in the penetrating opening. The heat-receiving part 12*b* of the housing 12 can extend to the second surface of the flexible board 32 or the vicinity of the second surface by passing through the penetrating opening. Accordingly, the heat-receiving part 12*b* is opposite to the driver IC 20 with the flexible board 32 interposed therebetween.

Figure 6:
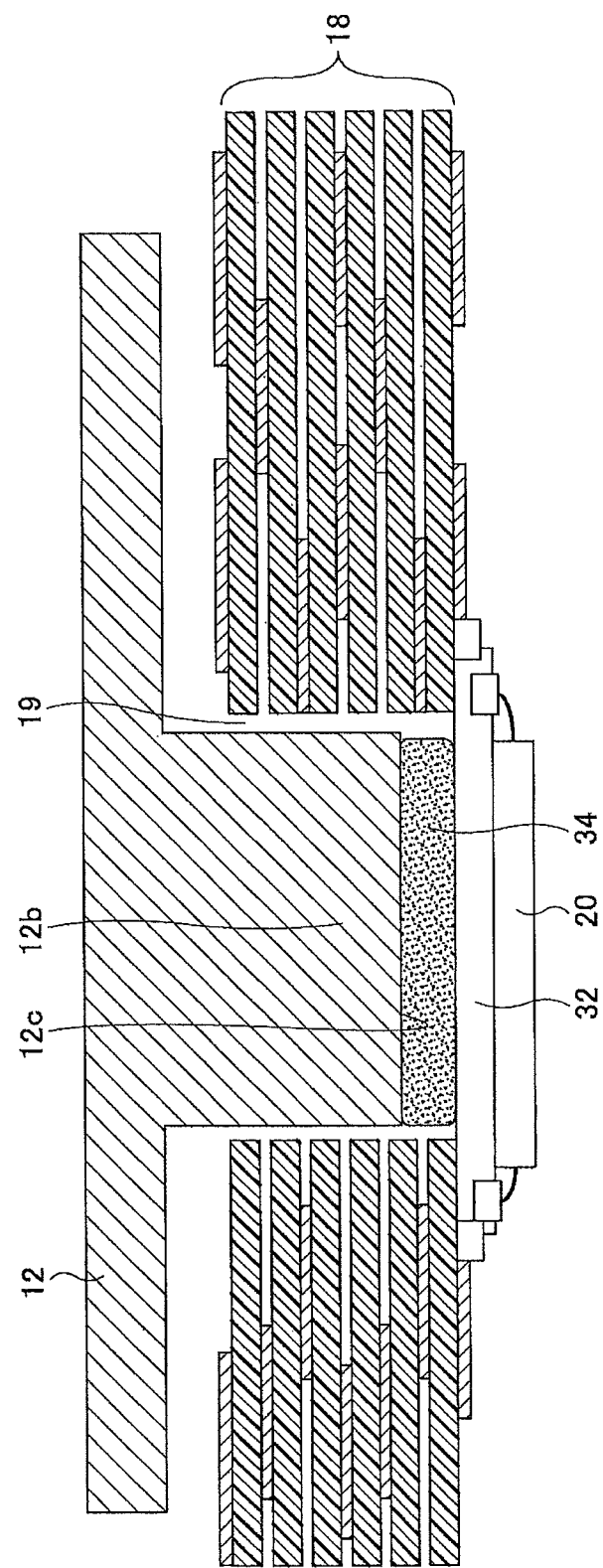
FIG. 6 is an enlarged view of a portion surrounded by a circle in FIG. 5.
Figure 7:
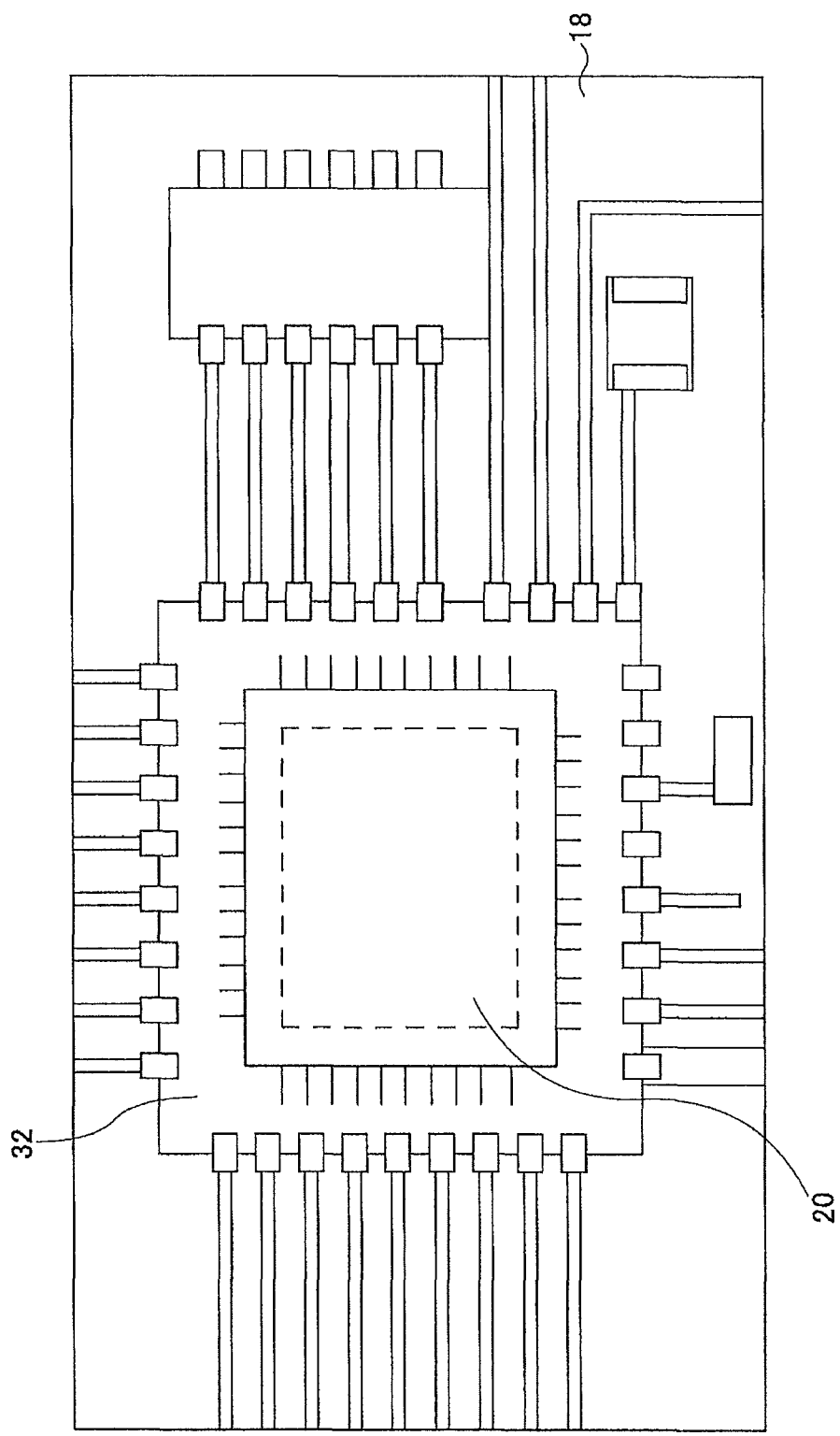
FIG. 7 is an enlarged plan view of the portion surrounded by the circle in FIG. 5.

FIG. 6 is an enlarged view of a portion surrounded by a circle in FIG. 5. FIG. 7 is an enlarged plan view of the portion surrounded by the circle in FIG. 5 viewed from the side of the driver IC. The flexible board 32 is mounted on the control board 18 so as to close the penetrating opening 19 of the control board 18. Accordingly, the lead terminals of the driver IC 20 are connected to the wiring patterns of the flexible board 32 and the wiring patterns of the flexible board 32 are connected to the wiring patterns of the control board 18, thereby forming a circuit equivalent to that of a case where the driver IC 20 is mounted on the control board 18.

As illustrated in FIG. 6, the heat-receiving part 12*b* of the housing 12 extends toward the flexible board 32 by passing through the penetrating opening 19 of the control board 18. Then, a flat top surface 12*c* of the heat-receiving part 12*b* is bonded to the flexible board 32 by a heat-release adhesive 34. The heat release adhesive 34 is an adhesive made of a material having a high thermal conductivity. The heat release adhesive adheres to the flat top surface 12*c* of the heat-receiving part 12*b* and the flexible board 32 so that a large amount of heat is transmissible from the flexible board to the heat-receiving part 12*b*.

The above-mentioned penetrating opening 19 is not always be formed as a penetrating hole but may be a notch part provided to an edge (side) of the control board 18. That is, if the mount position of the driver IC 20 in the control board 18 is close to an edge (side) of the control board 18, a notch which cuts into the control board 18 from the edge (side) may be provided instead of the penetrating opening 19.

Figure 8:
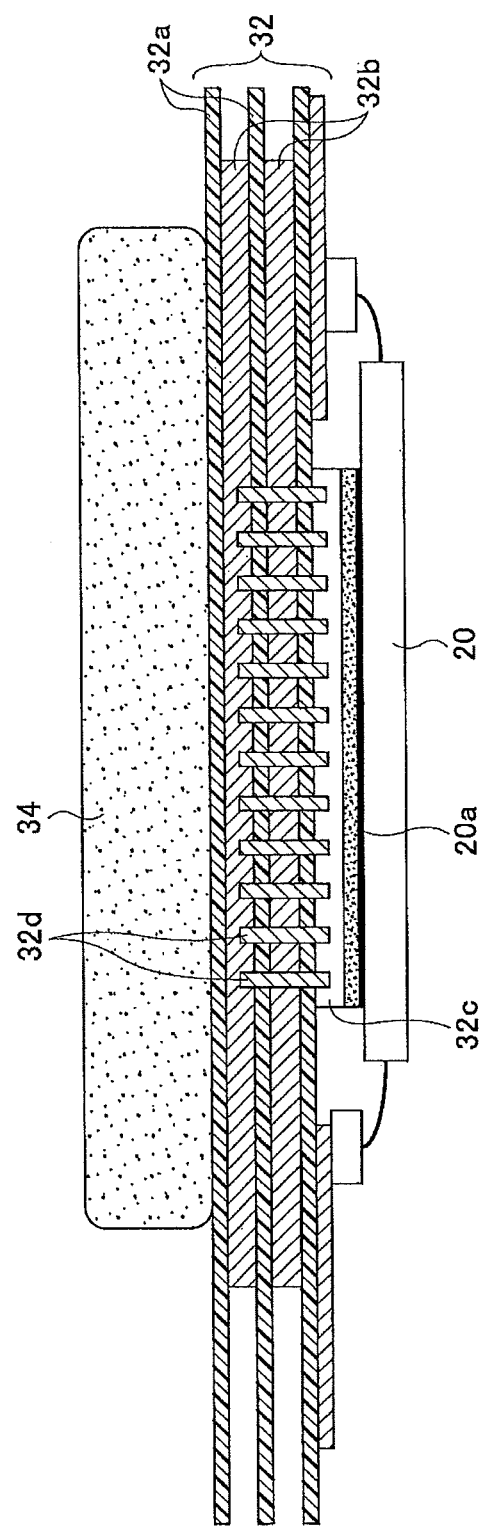
FIG. 8 is an enlarged cross-sectional view of a flexible board.

As illustrated in FIG. 8, the flexible board 32 has a structure in which coverlays 32a, which are made of an insulating base material, and conductive layers 32b are alternately laminated. The bottom electrode 20a of the driver IC is bonded to a heat release pad 32c of the flexible board 32. Vias 32d extend from the heat release pad 32c into an interior of the flexible board 32. However, the vias 32d do not reach the outermost coverlay 32a, which is bonded by the heat release adhesive 34. Accordingly, at least one layer of the coverlays 32 is interposed between the vias 32d, which are electrically connected to the driver IC 20, and the heat-receiving part 12b of the housing 12. The driver IC and the housing 12 are electrically separated from each other by the at least one layer of the coverlays 32a so as to suppress a static charge accumulated in the housing 12 from flowing to the driver IC 20. That is, the ESD problem with respect to the driver IC 20 is solved.

As mentioned above, the heat-receiving part 12b extending from the housing 12, which is a frame grounding part (FG), is electrically separated and insulated from the driver IC 20 connected to the control board 18, which is a signal grounding part (SG), by the coverlays 32a of the flexible board 32. Accordingly, a heat release structure is achieved, in which heat from the driver IC 20 is can be absorbed by the heat-receiving part 12b, which is a part of the housing 12, while the housing 12, which is a frame grounding part (FG) and the control board 18, which is a signal grounding part (SG) are electrically separated from each other surely.

The coverlay 32a formed of polyimide is extremely thin, and a thickness thereof is, for example, about 10 μm. The thermal conductivity of the polyimide is 0.2 W/mK, which is relatively small. However, because the coverlay 32a is extremely thin, a thermal resistance can be sufficiently small. Additionally, the polyimide has a heat resistance as used for a heat resistant tape. In the present embodiment, the coverlays (polyimide layers) of the flexible board is effectively used as not a mere insulating material but a thermal transmission path having an electrical insulating property. Such a method of use of the coverlay is not found in a conventional technique. Additionally, a study of a polyimide based material to provide a higher thermal conductivity has been progressed in recent years, and it is assumed that a polyimide material having a higher thermal conductivity than a present material may be developed. If such a polyimide material is used for the coverlay 32a, the ESD resistance can be further improved.

Figure 9:
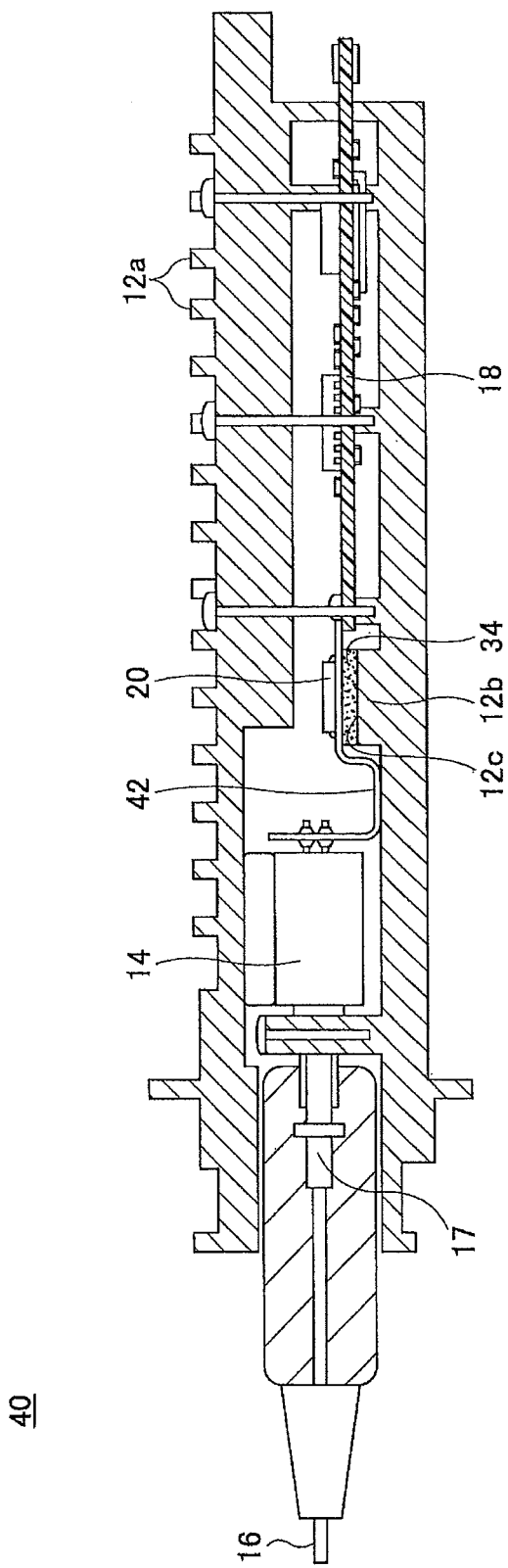
FIG. 9 is a cross-sectional view of an optical transceiver module according to a second embodiment.
Figure 10:
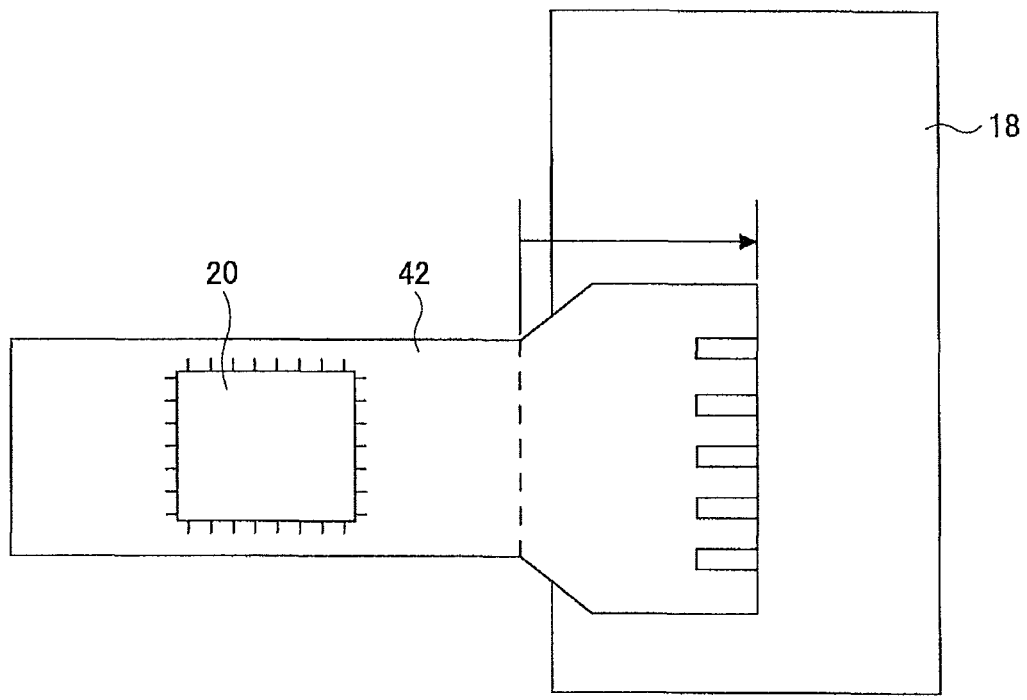
FIG. 10 is an enlarged plan view of a portion where the flexible board is connected to a control board.

A description will be given below, with reference to FIG. 9 and FIG. 10, of an optical module according to a second embodiment. FIG. 9 is a cross-sectional view of an optical transceiver module 40, which is an example of the optical module according to a second embodiment. In FIG. 9, parts that are the same as the parts illustrated in FIG. 1 are given the same reference numerals, and descriptions thereof will be omitted. FIG. 10 is an enlarged plan view of a vicinity of a portion in which a flexible board 42 illustrated in FIG. 9 is connected to the control board 18.

In the present embodiment, a flexible board 42 is provided between the optical input/output device 14 and the control board 18, and the driver IC 20 is mounted on the flexible board 42. That is, a distance between the optical input/output device 14 and the control board 18, which are illustrated in FIG. 1, is lengthened, and the flexible board 42 is formed by elongating a flexible board for electrically connecting the optical input/output device 14 and the control board 18. Therefore, the flexible board 32 on which the driver IC is mounted is not mounted on the control board as is in the first embodiment, and, instead, the flexible board 42 on which the driver IC 20 is mounted is connected to the control board 18. Thus, the driver IC 20 is mounted on the flexible board 42 extending between the optical input/output device 14 and the control board 18.

The heat-receiving part 12b as a part of the housing 12 protrudes toward inside in a back surface side at a position where the driver IC 20 is mounted. The top surface 12c of the heat-receiving part 12b is a planar surface, and is bonded to the second surface of the flexible board 42 (opposite to the first surface on which the driver IC is mounted) by the heat release adhesive 34. The top surface 12c of the heat-receiving part 12b is larger than the driver IC 20. The top surface 12c supports the flexible board 42 so that a portion of the flexible board 42 where the driver IC 20 is mounted aligns with a portion of the flexible board 42 connected to the control board 18 along a straight line.

Because it is possible that the connecting portion of the flexible substrate connected to the control part is damaged if a bending stress is applied, the connecting portion is set as a bending prohibited area, and measures may be taken to avoid a bending stress being applied to the connecting portion. However, according to the present embodiment, the flexible board 42 is maintained in a straight state (planar surface) by the top surface 12c of the heat-receiving part 12b, and, thereby, there is no need to take measures to avoid bending.

In the above-mentioned structure, the heat-receiving part 12b is positioned directly under the driver IC 20. Accordingly, heat released from the bottom electrode of the driver IC 20 is transmitted directly to the housing 12 via the flexible board 42 and the heat release adhesive 34 (without going through air), and, then, released to outside from the housing 12, which improves a heat release efficiency of the driver IC 20. The flexible board 42 has the same structure as the flexible board 32 illustrated in FIG. 8, and the driver IC 20 and the housing 12 are electrically separated from each other by the coverlay of the flexible board 42. Thus, as explained with reference to the flexible board 32, a static charge accumulated in the housing is prevented from flowing to the driver IC 20, which solves the ESD problem with respect to the driver IC 20.

In the above-mentioned first and second embodiments, the heat transfer coefficient between the housing 12 and each of the flexible substrates 32 and 42 is improved by making each of the flexible boards 32 and 42 to adhere to the top surface 12c of the heat-receiving part 12b by the heat release adhesive 34. Because such a fixation by bonding permits a reduction in the length of the thermal transmission path, a sufficient heat release can be achieved even if, for example, a thermal conductivity is relatively small as in a silicon based heat release adhesive (thermal conductivity: approximately 3 W/mK). Additionally, because a mechanical strength is large, there also is an effect in that the flexible board can be fixed so that the flexible board does not bend.

However, instead of the heat release adhesive, a sheet having a heat release property may be interposed between the top surface 12c of the heat-receiving part 12b and each of the flexible board 32 and 42. As a sheet having a heat release property, for example, a graphite sheet may be used. It is possible that a gap is formed between the top surface 12c of the heat-receiving part 12b and each of the flexible board 32 and 42 if the sheet is merely arranged between the top surface 12c of the heat-receiving part 12b and each of the flexible board 32 and 42. Thus, a pressure sensitive adhesive may be applied to the graphite sheet and the graphite sheet may be applied to the top surface 12c of the heat-receiving part 12b and each of the flexible board 32 and 42. Alternatively, similar to the silicon heat release sheet, a heat release sheet itself having adhesion may be used. Additionally, a silicon heat release sheet having elasticity may be interposed between the top surface 12c of the heat-receiving part 12b and each of the flexible board 32 and 42. In such a case, there is no adhesive or pressure sensitive adhesive fixed to the top surface 12c of the heat-receiving part 12b and each of the flexible board 32 and 42, thereby providing an advantage in that disassembling can be easily performed when repairing. If each of the flexible boards 32 and 42 are a part which must be removed when disassembling the optical module, it is effective to use the silicon heat release sheet having elasticity. Or, it may be determined whether to use the silicon heat release sheet having elasticity or use an adhesive of pressure sensitive adhesive based on a frequency of repair.

Moreover, although the heat-receiving part 12b of the housing 12 is used as a heat release member (heat sink) so as to absorb heat from the driver IC and release to outside in the above-mentioned first and second embodiments, the heat release member (heat-receiving part 12b) is not always necessary to be a part of the housing. A heat release member (heat-receiving part 12b) may be created separately from the housing, and the heat release member may be connected to the housing 12. Alternatively, if there is a mechanism part, which tends to easily release heat, other than the housing 12, the heat release member may be connected to the mechanism part.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention (s) has(have) been described in detail, it should be understood that the various changes, substitutions, and alterations could be made hereto without departing from the spirit and scope of the invention.

What is claimed is:

1. An optical module comprising:
    a flexible board having a first surface at which a heat generating electronic component is mounted, a second surface opposite to the first surface, a plurality of electrically insulating layers, a plurality of conductive layers, a heat release layer formed on the first surface, and a plurality of electrically conductive heat release vias,
    wherein the plurality of electrically insulating layers and the plurality of conductive layers are alternately laminated such that each of the plurality of conductive layers is laminated between two of the electrically insulating layers,
    wherein a first layer of the plurality of electrically insulating layers includes the first surface, and a second layer of the plurality of electrically insulating layers includes the second surface;
    an electrode part having a bottom surface on which a heat release electrode is provided, and being mounted at the first surface of the flexible board;
    a housing configured to accommodate the flexible board and the electrode part; and
    a heat receiving part that forms a part of the housing and is configured to absorb heat from the electrode part and release the heat outside the optical module,
    wherein the plurality of electrically insulating layers is arranged between the heat release electrode and the heat receiving part,
    wherein the heat receiving part is arranged adjacent to the second surface of the flexible board at a position corresponding to where the electrode part is mounted,
    wherein the plurality of vias penetrates the plurality of electrically insulating layers excluding the second layer, and
    wherein one end of each of the plurality of vias connects to the heat release layer, and another end of each of the plurality of vias reaches one of the plurality of conductive layers in contact with the second layer, but does not reach the second layer.

2. The optical module as claimed in claim 1, wherein a heat release sheet is arranged between the heat receiving part and the second surface of the flexible board.

3. The optical module as claimed in claim 2, wherein the heat release sheet is a graphite sheet that is applied to the heat receiving part and the second surface of the flexible board.

4. The optical module as claimed in claim 2, wherein the heat release sheet is a silicon heat release sheet having elasticity.

5. The optical module as claimed in claim 1, wherein a first surface of the heat receiving part opposite the second surface of the flexible board is a planar surface, and a portion of the flexible board corresponding to where the electrode part is mounted is supported by the first surface of the heat receiving part.

6. The optical module as claimed in claim 1, further comprising:
    a rigid board on which parts other than the electrode part are mounted,
    wherein the rigid board has a penetrating opening or a notch part,
    wherein the flexible board is mounted on the rigid board so that the second surface of the flexible board is exposed in the penetrating opening or notch part, and
    the heat receiving part is arranged in a vicinity of the second surface of the flexible board through the penetrating opening or notch part.

7. The optical module as claimed in claim 1, further comprising:
    a rigid board on which parts other than the electrode part are mounted,
    wherein an end of the flexible board is connected to the rigid board and the electrode part is mounted on the end of the flexible board, and
    the flexible board is supported by the heat receiving part in a planar state.

8. The optical module as claimed in claim 1, wherein the heat receiving part is bonded to the second surface of the flexible board by a heat release adhesive.

9. The optical module as claimed in claim 1,
    wherein each of the plurality of electrically insulating layers is formed by an overlay made of an electrically insulating base material, and
    wherein each of the overlays is associated with Bone of the plurality of conductive layers of the flexible board.

10. The optical module as claimed in claim 9,
    wherein one of the overlays forms the second surface of the flexible board, and
    wherein the heat receiving part is bonded to the one of the overlays by a heat release adhesive.

11. The optical module as claimed in claim 1,
wherein the flexible board integrally comprises the plurality of electrically insulating layers, the plurality of conductive layers, the heat release layer, and the plurality of vias.

12. The optical module as claimed in claim 1,
wherein the second layer electrically insulates the heat generating electronic component from the housing.

13. The optical module as claimed in claim 1,
wherein the position is a region in a plan view of the optical module.

14. The optical module as claimed in claim 1,
wherein the plurality of vias have a first ground potential that is the same as a potential of the heat release electrode, and
wherein the heat receiving part has a second ground potential that is the same as a potential of the housing.

15. The optical module as claimed in claim 1,
wherein the one end of each of the plurality of vias and the heat release layer are provided at the first surface of the flexible board.

\* \* \* \* \*